United States Patent [19]
Chen et al.

[11] Patent Number: 5,787,039
[45] Date of Patent: Jul. 28, 1998

[54] LOW CURRENT FLOATING GATE PROGRAMMING WITH BIT-BY-BIT VERIFICATION

[75] Inventors: Han-Sung Chen, Keelung; Tzeng-Huei Shiau, Hsin-Pu; Yu-Shen Lin, Taipei; Chung-Cheng Tsai, Houli; Jin-Lien Lin, Taoyuan, all of Taiwan; Ray Lin Wan, Fremont, Calif.; Yuan-Chang Liu, Miao-Li; Chun Hsiung Hung, Hsinchu, both of Taiwan

[73] Assignee: Macronix International Co., Ltd., Hsinchu, Taiwan

[21] Appl. No.: 812,615

[22] Filed: Mar. 6, 1997

[51] Int. Cl.[6] ............................................. G11C 16/06
[52] U.S. Cl. ........................ 365/185.22; 365/185.11; 365/185.13
[58] Field of Search ........................ 365/230.03, 185.22, 365/185.11, 185.13

[56] References Cited

U.S. PATENT DOCUMENTS

| | | | |
|---|---|---|---|
| 5,053,990 | 10/1991 | Kreifels et al. | 364/900 |
| 5,163,021 | 11/1992 | Mehrotra et al. | 365/201 |
| 5,172,338 | 12/1992 | Mehrotra et al. | 365/201 |
| 5,263,003 | 11/1993 | Cowles et al. | 365/230.03 |
| 5,297,096 | 3/1994 | Terada et al. | 365/218 |
| 5,317,535 | 5/1994 | Talreja et al. | 365/185 |
| 5,327,383 | 7/1994 | Merchant et al. | 365/218 |
| 5,357,463 | 10/1994 | Kinney | 365/218 |
| 5,379,413 | 1/1995 | Hazen et al. | 395/575 |
| 5,396,468 | 3/1995 | Harari et al. | 365/218 |
| 5,400,286 | 3/1995 | Chu et al. | 365/218 |
| 5,414,664 | 5/1995 | Lin et al. | 365/218 |
| 5,446,690 | 8/1995 | Tanaka et al. | 365/185.22 |
| 5,491,809 | 2/1996 | Coffman et al. | 395/430 |
| 5,526,309 | 6/1996 | Jinbo | 365/185.29 |
| 5,532,960 | 7/1996 | Lin et al. | 365/185.2 |
| 5,541,886 | 7/1996 | Hasbun | 365/230.01 |
| 5,559,956 | 9/1996 | Sukegawa | 365/182.06 |
| 5,636,162 | 6/1997 | Coffman et al. | 365/185.1 |
| 5,675,536 | 10/1997 | Sim | 365/185.22 |

*Primary Examiner*—Vu A. Le
*Attorney, Agent, or Firm*—Mark A. Haynes; Wilson, Sonsini, Goodrich & Rosati

[57] ABSTRACT

A system for programming arrays of floating gate memory cells reduces programming current requirements, and reduces wordline and bitline stress during programming. A word-to-be-programmed into a floating gate memory array is divided into a plurality of smaller subwords. Only one subword is programmed at a time, thereby reducing programming current requirements. Additionally, subwords which are successfully programmed are not reprogrammed even if bits in other subwords do not program properly. This creates less wordline stress than previous systems which program an entire word at once, thereby requiring subwords which program successfully to be reprogrammed along with subwords which fail to program. Finally, within each subword only those bits which failed to program are reprogrammed, thereby reducing bitline stress during reprogramming for those bits which were successfully programmed.

45 Claims, 9 Drawing Sheets

LOW CURRENT FLOATING GATE PROGRAMMING WITH BIT-BY-BIT VERIFICATION

BACKGROUND

1. Field of the Invention

The present invention relates to integrated circuit memory devices based upon floating gate transistor technology, and more particularly to reducing programming current requirements as well as bitline and wordline stress during programming of floating gate memory arrays.

2. Related Art

Flash memory is a growing class of non-volatile storage integrated circuit based on floating gate transistors. The memory cells in a flash device are formed using so called floating gate transistors in which the data is stored in a cell by charging or discharging the floating gate. The floating gate is a conductive material, typically polysilicon, which is insulated from the channel of the transistor by a thin layer of oxide, or other insulating material, and insulated from the control gate of the transistor by a second layer of the insulating material.

To store data in a floating gate memory cell, the floating gate is charged or discharged using a Fowler-Nordheim tunneling mechanism, or a hot electron injection mechanism. The Fowler-Nordheim tunneling mechanism is executed by establishing a large positive (or negative) voltage between the gate and source or drain of the device. This causes electrons to be injected into (or out of) the floating gate through the thin insulator. The hot electron injection mechanism is based upon an avalanche process. Hot electron injection is induced by applying potentials to induce high energy electrons in the channel of the cell, which are injected across the thin insulator into the floating gate. To induce hot electron injection, a potential is applied across the source and drain of the device, along with a positive potential on the control gate. The positive potential on the control gate tends to draw electrons from the current in the channel of the device into the floating gate. The acts of charging and discharging of the floating gate are difficult to control over a large array of cells. Thus, some of the cells program more quickly than others in the same device. In a given program operation, not all the cells subject to the operation will settle with the same amount of charge stored in the floating gate. As chip manufacturers begin to design arrays of floating gate memory cells to operate with non-programming supply voltages of three volts or less, it is becoming critical that all floating gate cells store nearly the same amount of charge, so that the arrays can operate in a narrower band of read voltage thresholds.

Program verify sequences have been developed to efficiently insure that the memory is accurately programmed. The program verify operation is based upon comparing the data stored in the floating gate memory array with the intended data. This is typically done on a word-by-word basis. If a failure is detected in the verify sequence, then the program operation is retried. Program retries are typically performed on a word-by-word basis in prior art devices. Consequently, bits successfully programmed in a word with only one failed bit are subject to the program cycle repeatedly. This can result in over-programming and cell failure.

One solution to this problem is to use so-called page mode devices. In page mode devices, a page buffer is associated with the memory array. This buffer comprises a single bit latch for each bitline in the memory array. To program the array, the page buffer is first loaded with the data-to-be-programmed by transferring the data one byte at a time (or one word at a time) into the page buffer. The entire page is then programmed into the array in parallel using the contents of the bit latches. The verify procedure automatically clears all of the bits in the page buffer which are successfully programmed into the array. The page buffer is then read one byte at a time (or one word at a time) to confirm that all bits have been cleared, thereby indicating a successful program operation. For example, see Tanaka et al., "High-Speed Programming and Program-Verify Methods Suitable for Low-Voltage Flash Memories," Symposium on VLSI Circuits, Digest of Technical Papers, 1994, pp. 64–62.

Another problem in programming floating gate arrays is to provide a sufficient source of programming current. If a large number of floating gate cells are programmed simultaneously, a large amount of current is required. For example, if all floating gate memory cells in a 16-bit word are programmed simultaneously, and each cell requires 250 uA current during programming, the entire 16-bit word will require 4 milliamps of programming current. This is not a problem if an external power supply is utilized to provide programming current. However, if an on-chip pumping circuit is used to provide the programming current, the on-chip pumping circuit will have to be large enough to meet this demand, and will consequently take up a large amount of silicon area.

One prior invention allows individual bytes of a word of floating gate memory to be programmed individually. See U.S. Pat. No. 5,317,535, entitled GATE/SOURCE DISTURB PROTECTION FOR 16-BIT EEPROM MEMORY ARRAYS by Talreja, et al. However, this invention does not achieve the goal of reducing programming current. Although this invention allows bytes to be programmed individually, the invention also allows an entire word to be programmed at once, thereby requiring a large amount of programming current and consequently requiring a large on-chip charge pump. Furthermore, the invention does not automatically break up a word into bytes for programming; explicit byte programming commands must be used to program bytes once at a time. Finally, this invention uses multiple wordline decoders (one for each byte) which consume a great amount of on-chip real estate.

What is needed is a programming system for arrays of floating gate memory cells which reprograms only those bits which fail program verify, and does not stress the gates or drains of cells which pass program verify. Additionally, what is needed is a system for programming floating gate arrays which reduces programming current requirements, thereby making it possible to use a smaller on-chip pumping circuit to generate the programming current.

SUMMARY

The present invention provides a method and the apparatus for programming arrays of floating gate cells which reduces programming current requirements and additionally reduces both wordline and bitline stress during reprogramming operations. The invention operates by automatically dividing a word-to-be-programmed into a plurality of smaller subwords, and programming these subwords one at a time.

More specifically, the invention operates by: (1) selecting an addressed word of memory with an addressing mechanism; (2) automatically programming the addressed word of memory one subword at a time; (3) verifying the programming of each subword in the addressed word of memory, wherein the verifying operation includes verifying the programming of each individual bit in each subword; and (4) automatically reprogramming only those subwords which fail to program within the addressed word, wherein this reprogramming takes place one subword at a time, and wherein only those bits which fail to program are reprogrammed.

The instant invention has a number of advantages. First, programming current is reduced because only one subword of memory is programmed at a time. Second, the invention creates less wordline stress because subwords which are successfully programmed are not reprogrammed. Finally, bitline stress is reduced because only those bits which fail to program are reprogrammed, and the bits which are successfully programmed are not reprogrammed.

Selective reprogramming of individual bits is accomplished by providing special column drivers for each bitline on the data bus. These special column drivers can be enabled by both subword and bit enable signals, allowing individual subwords and bits within individual subwords to be selected for programming and reprogramming. One embodiment of the present invention also includes a set of flags, one for each bit in the data bus, indicating whether a particular bit was successfully programmed.

The invention also uses a separate bi-level voltage source for each subword to power wordline drivers within each subword. These bi-level voltage sources apply programming voltages to selected subwords, and non-programming voltages to other subwords.

The present invention additionally has an external programming power bypass mode which disables subword-at-a-time programming when an off-chip source of programming power is available. In this way, faster word-at-a-time programming operations can be executed when an off-chip source of programming current is available. If not, subword-at-a-time programming can be used to reduce programming current.

The present invention has a number of advantages. (1) It allows for a reduction in the amount of silicon area taken up by an array of floating gate memory cells because a smaller on-chip pumping circuit can be used to generate programming current. (2) Unlike prior art systems which provide byte-at-a-time programming by using a plurality of row decoders, the present invention uses a single row decoder coupled to a plurality of bi-level voltage sources to power the wordline drivers. (3) Bitline disturb conditions are reduced by reprogramming only those bits which fail to program. (4) Wordline disturb conditions are reduced by only reprogramming those subwords which fail to program. (5) Finally, unlike page mode programming systems, a large page buffer structure and a tremendous amount of programming current are not required.

DESCRIPTION

The following description is presented to enable any person skilled in the art to make and use the invention, and is provided in the context of a particular application and its requirements. Various modifications to the preferred embodiment will be readily apparent to those skilled in the art, and the general principles defined herein may be applied to other embodiments and applications without departing from the spirit and scope of the invention. Thus, the present invention is not intended to be limited to the embodiment shown, but is to be accorded the widest scope consistent with the principles and features disclosed herein.

Figure 1:
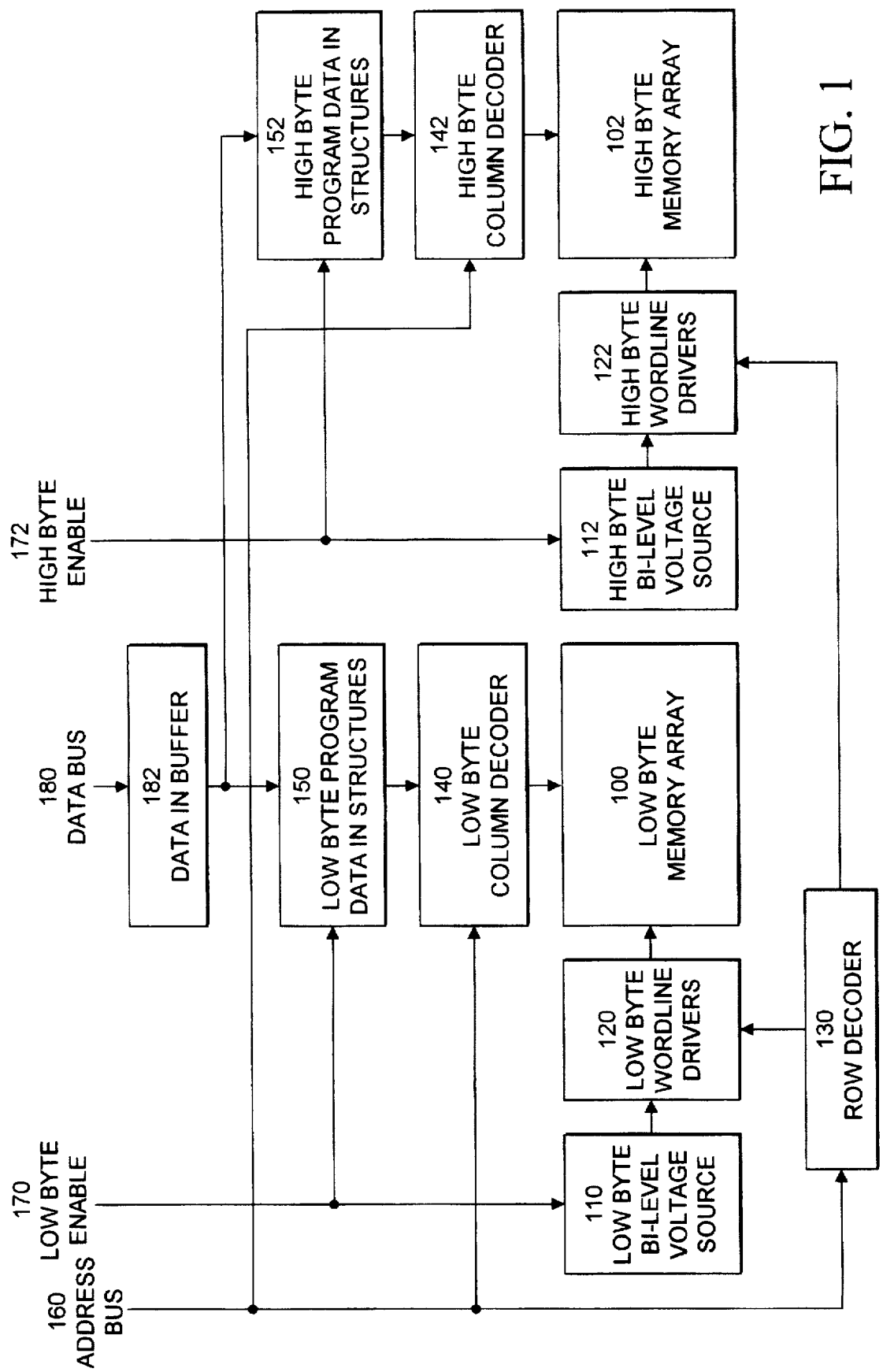
FIG. 1 is a block diagram of the major functional components of a system for programming an array of floating memory cells in accordance with an aspect of the present invention.

FIG. 1 is a block diagram of the major functional components of a system for programming an array of floating gate memory cells in accordance with an embodiment of the present invention. In FIG. 1, the array of floating gate memory cells is divided into two pieces: Low Byte Memory Array 100, and a High Byte Memory Array 102, which together comprise a two byte (or 16-bit) memory array.

Low Byte Memory Array 100 has both row and column inputs. It accepts row inputs from Low Byte Wordline Drivers 120, which are powered by Bi-level Voltage Source 110. It accepts column inputs from Low Byte Column Decoder 140, which selects column inputs from Low Byte Program Data In Structures 150, which themselves accept data from the low byte of Data In Buffer 182.

High Byte Memory Array 102 also has both row and column inputs. High Byte Memory Array 102 accepts row inputs from High Byte Wordline Drivers 122, which are powered by High Byte Bi-level Voltage Source 112. High Byte Memory Array 102 accepts column inputs from High Byte Column Decoder 142 which accepts data from High Byte Program Data In Structures 152, which themselves accept data from the high byte of Data In Buffer 182.

The memory array illustrated in FIG. 1 accepts a number of programming inputs. Address bus 160 is an input which splits off into a column address and a row address. The column address feeds into both Low Byte Column Decoder 140, and High Byte Column Decoder 142. Low Byte Column Decoder 140 uses this column address to route programming data from Low Byte Program Data In Structures 150 into selected bitlines of Low Byte Memory Array 100. High Byte Column Decoder 142 uses this column address to route data from High Byte Program Data In Structures 152 into selected bitlines of High Byte Memory Array 102. The row address feeds into Row Decoder 130, which decodes this row address into a set of enable signals which are used to enable selected wordline drivers from both Low Byte Wordline Drivers 120 and High Byte Wordline Drivers 122.

Data Bus 180 is also an input to the memory array illustrated in FIG. 1. Data Bus 180 feeds into Data In Buffer 182, which latches the contents of Data Bus 180 for input into both Low Byte Memory Array 100 and High Byte Memory Array 102. The output of Data In Buffer 182 splits into a low byte and a high byte. The low byte feeds into Low Byte Program Data In Structures 152, which feed into Low Byte Memory Array 100. The high byte feeds into High Byte Program Data In Structures 152, which feed into High Byte Memory Array 102.

Finally, two inputs to the memory array are enable signals: Low Byte Enable Signal 170, and High Byte Enable Signal 172. These enable signals originate from a control structure for the floating gate memory array which is not shown. Low Byte Enable 170 feeds into Low Byte Bi-level Voltage Source 110, where it selectively switches the power emanating from Low Byte Bi-level Voltage Source 110 between a twelve volt wordline programming voltage and a five volt non-programming voltage. Low Byte Enable 170 also feeds into Low Byte Program Data In Structures 150 where it enables drain programming voltages which feed into columns of Low Byte Memory Array 100 through Low Byte Column Decoder 140.

High Byte Enable 172 feeds into High Byte Bi-level Voltage Source 112 and High Byte Program Data In Structures 152. High Byte Enable 172 switches High Byte Bi-level Voltage Source 112 between a wordline programming voltage of twelve volts and a non-programming voltage of five volts. High Byte Enable 172 also feeds into High Byte Program Data In Structures 152 where it enables drain programming voltages which feed into columns of High Byte Memory Array 102 through High Byte Column Decoder 142.

Figure 2:
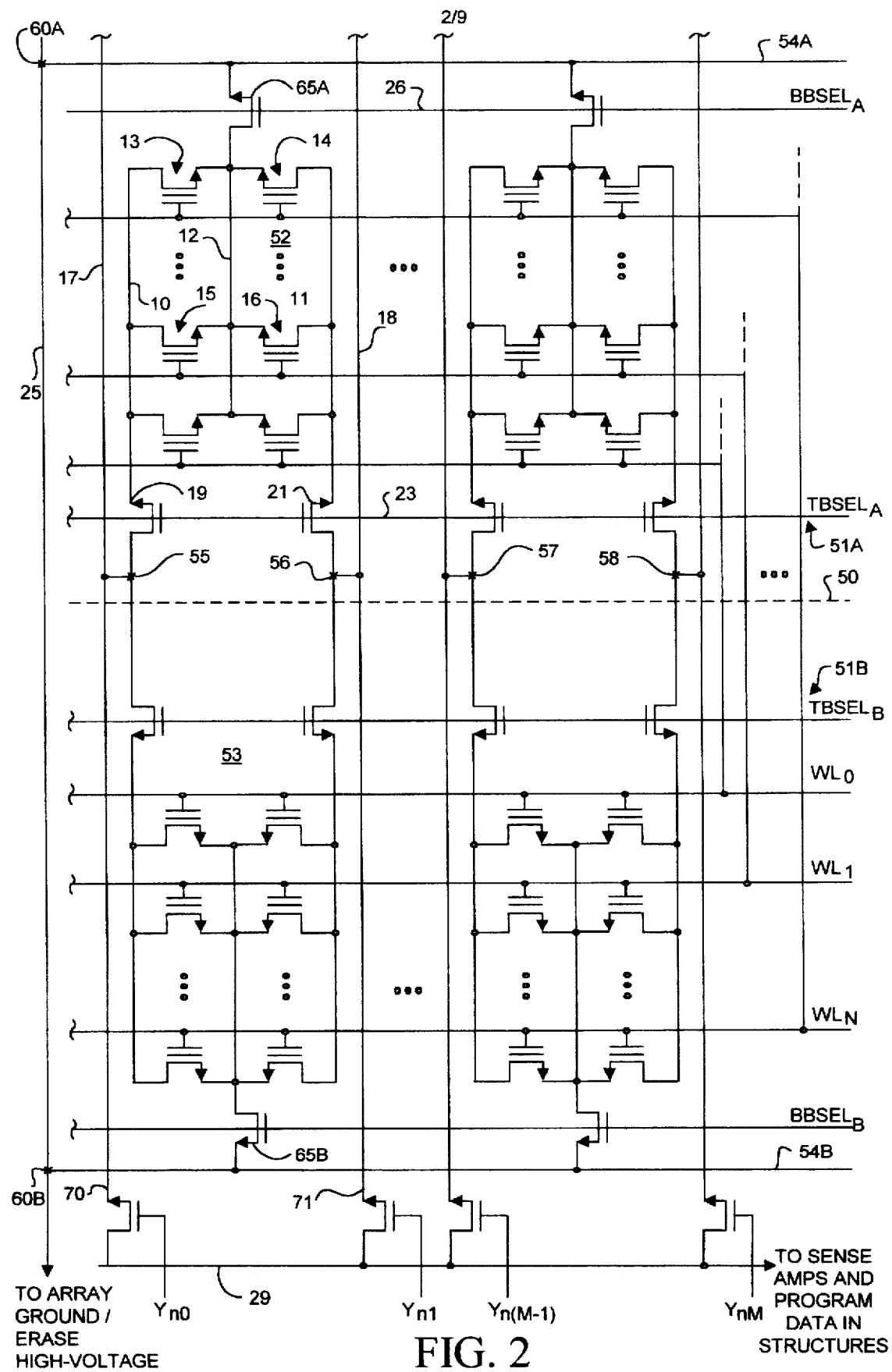
FIG. 2 is a circuit diagram showing an array of floating gate memory cells in accordance with an aspect of the present invention.

FIG. 2 illustrates a segmentable array architecture, using a drain-source-drain configuration of the FLASH EPROM circuit, as described in U.S. Pat. No. 5,414,664, entitled FLASH EPROM WITH BLOCK ARRAY FLAGS FOR OVER-ERASE PROTECTION, which is now owned and at the time of its invention by the same Assignee as the present application. This patent is hereby incorporated by reference.

The circuit includes a first local bitline 10 and a second local bitline 11. The first and second local bitlines, 10 and 11, are implemented using buried diffusion conductors. Also, included is a local virtual ground line 12 implemented by buried diffusion. A plurality of floating gate transistors having gates, drains and sources are coupled to the local bitlines 10 and 11 and to virtual ground line 12. The sources of the plurality transistors are coupled to the local virtual ground line 12. The drains of a first column of transistors, generally 13, are coupled to the first local bitline 10, and the drains of a second column of transistors, generally 14, are coupled to the second local bitline 11. The gates of the floating gate transistors are coupled to wordlines $WL_0$ through $WL_N$, where each wordline (e.g., $WL_1$) is coupled to the gate of a transistor (e.g., transistor 15) in the first local bitline 10, and a transistor (e.g., transistor 16) in the second local bitline 11. Thus, transistors 15 and 16 can be considered a two transistor cell with a shared source diffusion.

The act of charging the floating gate is called the "program step" for the FLASH EPROM cell. This is accomplished on a byte by byte basis through hot electron injection by establishing a large positive voltage between the gate and the source, such as twelve volts, and a positive voltage between the drain and the source, such as six volts.

A first global bitline 17 and a second global bitline 18 are associated with each drain-source-drain block. The first global bitline 17 is coupled to the source of top block select transistor 19 through a metal-to-diffusion contact 55. Similarly, the second global bitline 18 is coupled to the source of top block select transistor 21 through a metal-to-diffusion contact 56. The drains of the top block select transistors 19, 21 are coupled to the first and second local bitlines 10 and 11, respectively. The gates of the top block selector transistors, 19 and 21, are controlled by a top block select signal $TBSEL_A$ on line 23.

The local virtual ground line 12 is coupled to a virtual ground terminal across conductor 54A through bottom block selector transistor 65A. The drain of the bottom block select transistor 65A is coupled to the local virtual ground line 12. The source of the bottom block select transistor 65A is coupled to the conductor 54A. The gate of the bottom block select transistor 65A is controlled by a bottom block select signal $BBSEL_A$ across line 26. In the preferred system, the conductor 54A is a buried diffusion conductor which extends to a metal-to-diffusion contact 60A at a position displaced horizontally through the array, which provides contact to a vertical metal virtual ground bus 25.

The global bitlines extend vertically through the array to respective column select transistors 70 and 71, through which a selected global bit line is coupled to a sense amplifier and program data circuitry (not shown). Thus, the source of column select transistor 70 is coupled to global bitline 17, the gate of column select transistor 70 is coupled to column decode signal $Y_{n0}$, and the drain of the column select transistor 70 is coupled to conductor 29.

The blocks of FLASH EPROM cells as shown in FIG. 1 are configured into a plurality of subarrays as illustrated in FIG. 2. FIG. 2 illustrates two subarrays within a larger integrated circuit. The subarrays are divided generally along dotted line 50 and include subarray 51A, generally above the line 50, and subarray 51B, generally below the line 50. A first group 52 of cells is laid out in a mirror image with a second group 53 of cells along a given bit line pair (e.g., bitlines 17 and 18). As one proceeds up the bitline pair, the memory subarrays are flipped so as to share virtual ground conductors 54A and 54B (buried diffusion) and metal-to-diffusion contacts 55, 56, 57 and 58. The virtual ground conductors 54A and 54B extend horizontally across the array to a vertical virtual ground metal line 25 through metal-to-diffusion contacts 60A and 60B. The subarrays repeat on opposite sides of the metal virtual ground line 25 so that adjacent subarrays share a metal virtual ground line 25. The metal virtual ground line 25 is coupled to array ground and erase high-voltage circuitry. Thus, the subarray layout requires two metal contact pitches per column of two transistor cells for the global bitlines and one metal contact pitch per subarray for the metal virtual ground line 25.

Furthermore, two or more subarrays as illustrated in FIG. 2 may share wordline signals as illustrated because of the additional decoding provided by the top and bottom block select signals $TBSEL_A$, $TBSEL_B$, $BBSEL_A$, and $BBSEL_B$. In the preferred system, each block is configured to include four subarrays in a column, a row in each subarray, sharing a common wordline driver with rows in the other three subarrays. Decoding amongst the four subarrays is executed using the top block select transistors in response to $TBSEL_A$ and $TBSEL_B$. Each subarray includes 32 wordlines and 1K (1,024) bitlines. Thus, with four subarrays, 32 wordlines deep, and 1K bitlines wide, a block of 128K cells is provided. Thirty-two blocks make a 4 megabit memory.

Figure 3:
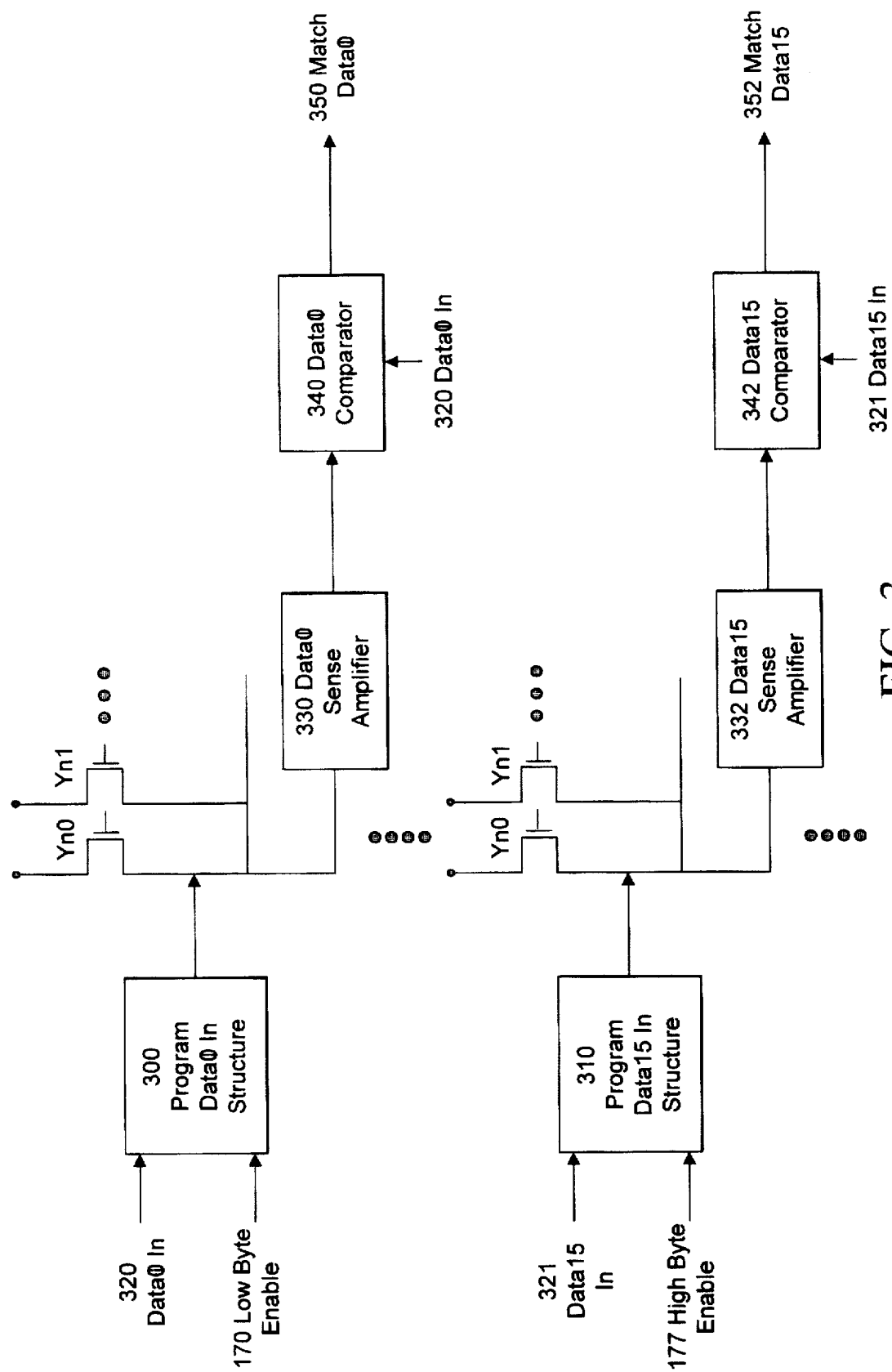
FIG. 3 is a diagram showing how "program in" structures and sense amplifiers connect to the column lines of an array of floating gate memory cells in accordance with an aspect of the present invention.

FIG. 3 illustrates how program data in structures and sense amplifiers connect to column lines of an array of floating gate memory cells in accordance with an embodiment of the present invention. More specifically, FIG. 3 illustrates the connections "To Sense Amps and Program Data In Structures" specified in the lower right-hand corner of FIG. 2. Program Data0 In Structure 300 takes in Data0 In signal 320 and Low Byte Enable signal 170 and generates and an output which feeds into column lines of the floating gate memory array which correspond to bit 0 of the data bus. When the floating gate memory cell corresponding to bit 0 is programmed, the output of the floating gate memory cell is channeled through column lines into Data0 Sense Amplifier 330, which amplifies the signal to its proper high or low voltage. This amplified signal is routed into Data0 Comparator 340, which also accepts Data0 In signal 320 as an input and outputs Match Data0 signal 350. Match Data0 Signal 350 indicates that the contents of the floating gate matches Data0 In 320.

FIG. 3 also illustrates the program data in structure and sense amplifier for Data0 In signal 321. Program Data15 In Structure 310 takes in Data15 In signal 321 and High Byte Enable signal 172. It generates an output which feeds into the column lines of the floating gate memory array corresponding to bit 15 of Data Bus 182. Once the proper floating gate cell is programmed, the programming is verified by outputting the cell's contents into Data15 Sense Amplifier 332. This amplifies the signal to its proper high or low voltage. This amplified signal is routed into Data15 Comparator 342, which also takes Data15 In signal 321 as an input and outputs Match Data15 352, which indicates whether the contents of the floating gate cell matches the value of bit 15 of Data Bus 182.

The same structure is replicated for all bits between bit 0 and bit 15 of Data Bus 182. The program data in structures for the first eight bits, bit 0 to bit 7, take in Low Byte Enable signal 170. Whereas, the program data in structures for the last eight bits, bit 8 to bit 15, take in High Byte Enable signal 172. These byte enable signals 170 and 172 allow a drain programming voltage to be applied to only one of the two bytes at a time, thereby reducing current consumption on the memory cells of the unselected byte.

Figure 4:
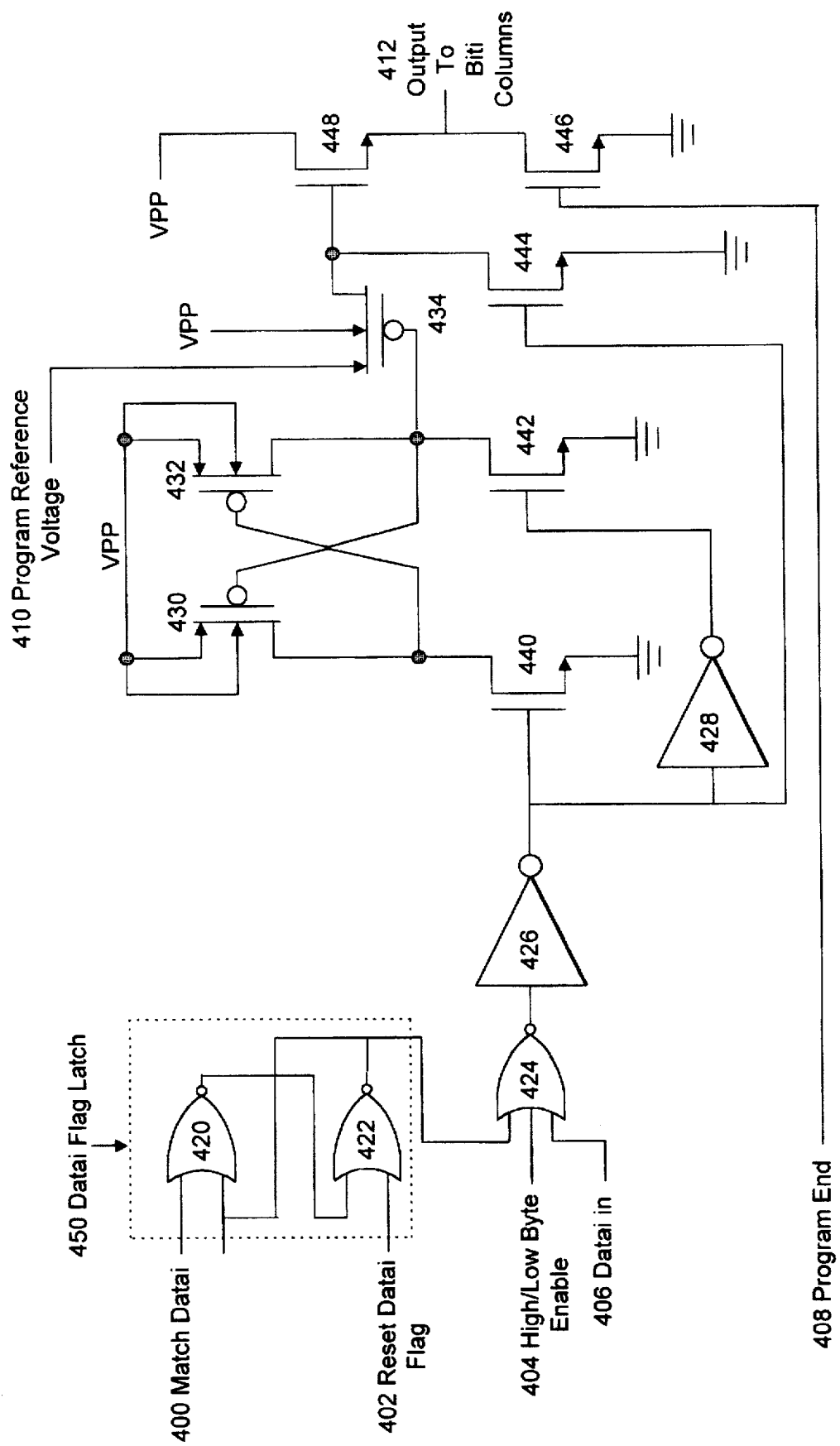
FIG. 4 is a circuit diagram of a "data in" structure corresponding to a single bit of the data bus in accordance with an aspect of the present invention.

FIG. 4 illustrates the internal structure for the program data in structures appearing in FIG. 3. Each program data in structure has in a number of inputs. Match Datai 400 indicates that the datai bit is programmed properly within the floating gate memory array. Reset Datai Flag signal 402 resets the flag indicating that datai needs to be reprogrammed. High/Low Byte Enable signal 404 connects to either Low Byte Enable signal 170 or High Byte Enable signal 172, depending upon whether or not datai is in the high or low byte. Datai In signal 406 connects to the datai bit of Data Buffer 182. Finally, Program End signal 408 originates in the control circuitry of the array (not shown) and indicates that the programming process is finished.

NOR gates 420 and 422 are connected input to output in a bistable configuration to form Datai Flag Latch 450, which stores a bit indicating whether datai was properly programmed. More specifically, NOR gate 420 uses Match Datai signal 400 and the output of NOR gate 422 to generate an output which feeds into an input of NOR gate 422 along with Reset Datai Flag 402. Normally, both the Match Datai signal 400 and Reset Datai Flag 402 are at a low value. When this is the case, the content of Datai Flag Latch 450 remains unchanged from its prior value. When the Match Datai signal 400 is asserted to a high value, NOR gate 420 outputs a low value, which feeds into an input of NOR gate 422. Assuming that the Reset Datai Flag signal 402 remains at a low value, the output of NOR gate 422 will be high. When Match Datai signal 400 subsequently goes low again, the high output of NOR gate 422 will remain high until Reset Datai Flag 402 is asserted to reset Data Flag Latch 450.

The Reset Datai Flag signal 402 is used to reset Datai Flag Latch 450. When Reset Datai Flag 402 is asserted to a high value, it forces NOR gate 422 to output a low value. If Match Datai Signal 400 is low, the output of NOR gate 420 becomes high. This feeds back into an input of NOR gate 422, but does not change the output of NOR gate 422 from its newly-assumed low value. Data Flag Latch 450 is thereby reset.

NOR gate 424 takes inputs from: the output of NOR gate 422, High/Low Byte Enable signal 404 and Datai In signal 406. If any of these inputs are high, the output of NOR gate 424 goes low. The output of NOR gate 424 feeds through inverter 426, into: the gate input of n-channel transistor 440, the input of inverter 428 and the gate input to n-channel transistor 444. The output of inverter 428 feeds into the gate input of n-channel transistor 442. The drain of n-channel transistor 440 connects to ground, and the source of n-channel transistor 440 connects to the drain of p-channel transistor 430 as well as the gate of p-channel transistor 432. The drain of n-channel transistor 442 connects to ground, and the source of n-channel transistor 442 connects to the gate of p-channel transistor 430, the drain of p-channel transistor 432 and the gate of p-channel transistor 430. The source of p-channel transistor 430 as well as the substrate of p-channel transistor 430 connect to VPP, which is a high programming voltage level. Similarly, the source of p-channel transistor 432 as well as the substrate of p-channel transistor 432 also connect to VPP. The source of p-channel transistor 434 connects to Program Reference Voltage 410, and the substrate of p-channel transistor 434 connects to VPP. The drain of p-channel transistor 434 connects to the source of n-channel transistor 444 and the gate of n-channel transistor 448. The drain of n-channel transistor 444 connects to ground. The source of n-channel transistor 448 connects to VPP, and the drain of n-channel transistor 448 connects to the source of n-channel transistor 446, as well as Output To Bit i Columns 412. Finally, the gate of n-channel transistor 446 connects to the Program End signal 408, and the drain of n-channel transistor 446 connects to ground.

The above-described circuit operates as follows. When the output of Datai Flag Latch 450 is de-asserted to a high value, or High/Low Byte Enable Signal 404 is de-asserted to a high value, the output of NOR gate 424 goes low, which causes the output of inverter 426 to go high. This high value feeds into the gate of n-channel transistor 440, causing the source of n-channel transistor 440 to connect to ground. The high voltage output of inverter 426 feeds through inverter 428 to drive a low input into the gate of n-channel transistor 442, thereby decoupling the source of n-channel transistor 442 from the ground voltage at the drain of n-channel transistor 442. The low voltage at the source of n-channel transistor 440 feeds into the gate input of p-channel transistor 432, thereby creating a conducting path between VPP and the drain of p-channel transistor 432, which connects into the gate of p-channel transistor 434. This drives high voltage into the gate of p-channel transistor 434, causing the drain of p-channel transistor 434 to be decoupled from the Program Reference Voltage 410, which connects to the source of p-channel transistor 434.

The high voltage output of inverter 426 also feeds into the gate input of n-channel transistor 444 causing a conducting path between the source of n-channel transistor 444 and the drain of n-channel transistor 444, which is tied to ground. This ground value feeds into the gate input of n-channel transistor 448 causing the drain of n-channel transistor 448 to be decoupled from VPP. Assuming Program End signal 408 is set to a low value, the gate of n-channel transistor 446 is also low value. This decouples the source of n-channel transistor 446 from the drain of n-channel transistor 446 which is tied to ground. Because the gate inputs to both n-channel transistors 446 and 448 set to a low voltage, the Output To Bit i Columns 412 is decoupled from both VPP and ground. Consequently, Output to Bit i Columns 412 assumes a floating voltage.

Datai In signal 406 influences the circuit as follows. When the output of Datai Flag Latch 450 and High/Low Byte Enable signal 404 are both asserted to a low value, Datai In signal 406 controls the Output To Bit i Columns 412. If Datai In signal 406 is a high voltage, the output of inverter 424 assumes a low voltage, which causes the Output To Bit i Columns 412 to float in the same way that de-asserting the High/Low Byte Enable signal 404 or de-asserting the input from Datai Flag Latch 450 causes Output To Bit i Columns 412 to float.

If Datai In signal 406 assumes a low value, the output to NOR gate 424 will assume a high value, causing the output of inverter 426 to go low. This low value feeds into the gate input of n-channel transistor 440 and through inverter 428 to drive a high voltage into the gate input of n-channel transistor 442. This creates a conducting path between the source of n-channel transistor 442 and the drain of n-channel transistor 442, which is tied to ground. This ground value feeds into the gate input of p-channel transistor 434, causing the drain of p-channel transistor 434 to connect to Program Reference Voltage 410 at the source of p-channel transistor 434. The low output of inverter 426 also feeds into the gate input of n-channel transistor 444 causing the source of n-channel transistor 444 to be decoupled from the drain of n-channel transistor 444, which is connected to ground. The high voltage from the drain of p-channel transistor 434 connects into the gate input of n-channel transistor 448 causing Output To Bit i Columns 412 to connect to program drain voltage. A programming voltage will then flow through Output To Bit i Columns 412 into a selected bitline of the floating gate array.

Finally, whenever Program End Signal 408 is asserted to a high value, the gate input of n-channel transistor 446 assumes a high value, causing the source of n-channel transistor 446 to be connected to the drain of n-channel transistor 446, which connects to ground. This causes Output To Bit i Columns 412 to assume a ground value, thereby effectively disabling the programming voltage on the bitlines of the floating gate array.

Figure 5:
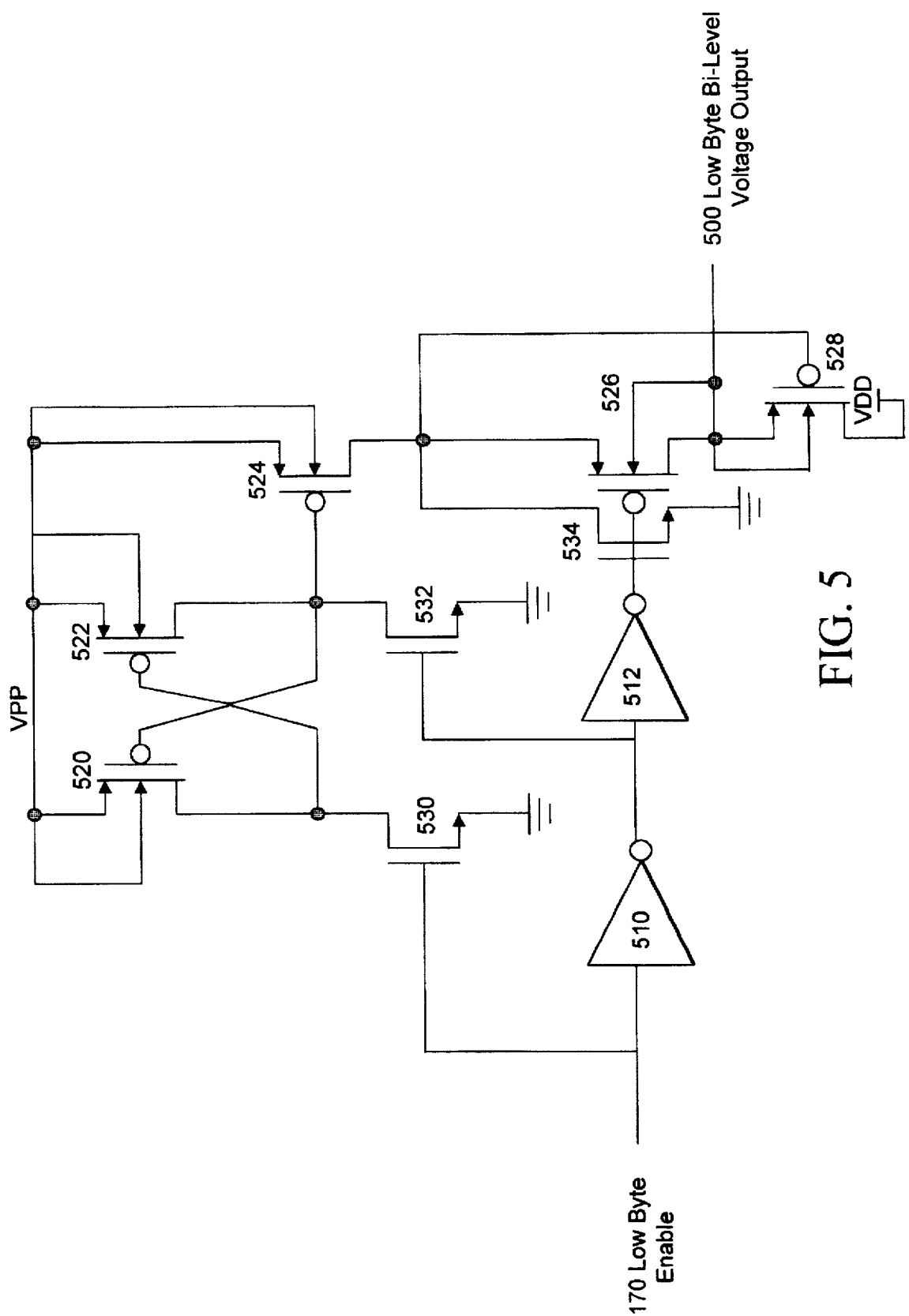
FIG. 5 is a circuit diagram for the Low Byte Bi-level Voltage Source 110 from FIG. 1.

FIG. 5 is a circuit diagram illustrating the internal structure of Low Byte Bi-level Voltage Source 110. This circuit takes in a single input, Low Byte Enable signal 170, and generates Low Byte Bi-level Voltage Output 500. Low Byte Enable signal 170 feeds into the gate input of n-channel transistor 530 and through inverter 510 into the gate input of n-channel transistor 532. The output of inverter 510 also feeds through inverter 512 into the gate input of n-channel transistor 534, and the gate input of p-channel transistor 526. The drain of n-channel transistor 530 connects to ground, and the source of n-channel transistor 530 connects to the gate input of p-channel transistor 522 as well as the drain of p-channel transistor 520. The drain of n-channel transistor 532 connects to ground, and the source of n-channel transistor 532 connects to the gate of p-channel transistor 520 as well as the drain of p-channel transistor 522. The source of n-channel transistor 532 also connects to the gate input of p-channel transistor 524. The source of p-channel transistor 520 as well as the substrate of p-channel transistor 520 connects to VPP. The source of p-channel transistor 522, as well as the substrate of p-channel transistor 522 also connects to VPP. The source of p-channel transistor 524 as well as the substrate of p-channel transistor 524 connects to VPP. The drain of p-channel transistor 524 connect to: the source of n-channel transistor 534, the source of p-channel transistor 526 and the gate input of p-channel transistor 528. The drain of n-channel transistor 534 connects to ground. The drain and substrate of p-channel transistor 526 both connect to Low Byte Bi-level Voltage Output 500. Low Byte Bi-level Voltage Output 500 also connects to the substrate of p-channel transistor 528 and the source of p-channel transistor 528. Finally, the drain of p-channel transistor 528 connects to VDD (which is typically five volts).

The Low Byte Bi-level Voltage Source 110 operates as follows. When Low Byte Enable Signal 170 is asserted to a low value, it causes the gate input to n-channel transistor 530 to assume a low value. This low value also feeds through inverter 510 to drive a high voltage into the input of n-channel transistor 532. This creates a conducting path between the source of n-channel transistor 532 and the drain of n-channel transistor 532 which is connected to ground. The source of n-channel transistor 532 thereby assumes a low voltage which feeds into the gate input of p-channel transistor 524 causing a conducting path between the source of p-channel transistor 524, which is connected to VPP, and the drain of p-channel transistor 524. The high voltage on the drain of p-channel transistor 524 connects to the gate input of p-channel transistor 528 causing the source of p-channel transistor 528, which is connected to low byte bi-level voltage output 512, to be isolated from VDD at the drain of p-channel transistor 528. The high voltage output of inverter 510 then feeds through inverter 512 to create a low voltage at the input to n-channel transistor 534 and the gate input to p-channel transistor 526. This isolates the source from the drain of n-channel transistor 534, and creates a conducting path between the source of p-channel transistor 526, which is connected to VPP, and the drain of p-channel transistor 526, which connects to Low Byte Bi-level Voltage Output 500. Therefore, Low Byte Bi-level Voltage Output 510 is connected to VPP, causing Low Byte Wordline Drivers 120 to assert programming voltages into Low Byte Memory Array 100.

When Low Byte Enable Signal 170 is de-asserted to a high value, the gate input to n-channel transistor 530 assumes a high value. This high value also feeds through inverter 510 to drive a low value into the gate input to n-channel transistor 532. The high value on the gate input to n-channel transistor 530 creates a conducting path between the source of n-channel transistor 530, and the drain of n-channel transistor 530, which is connected to ground. The source of n-channel transistor 530 also connects to the gate input to p-channel transistor 522 causing the gate input to p-channel transistor 522 to assume a low value. This low value creates a conducting path between the source of p-channel transistor 522, which is connected to VPP, and the drain of p-channel transistor 522, which connects to the gate input of p-channel transistor 524. This causes the gate input to p-channel transistor 524 to assume a high value, thereby isolating the drain of p-channel transistor 524 from VPP. The low output of inverter 510 also feeds through inverter 512 to drive a high voltage into the gate inputs of n-channel transistor 534 and p-channel transistor 526. This causes a conducting path between the source of n-channel transistor 534 and the drain of n-channel transistor 534, which is connected to ground. This ground voltage feeds into the gate input of p-channel transistor 528 creating a conducting path between VDD, at the drain of p-channel transistor 528, and Low Byte Bi-level Voltage Output 500, at the source of p-channel transistor 528. VDD from Low Byte Bi-level Voltage Output 500 therefore feeds into Low Byte Wordline Drivers 120, causing a non-programming voltage to be applied to the wordlines of Low Byte Memory Array 100.

Figure 6:
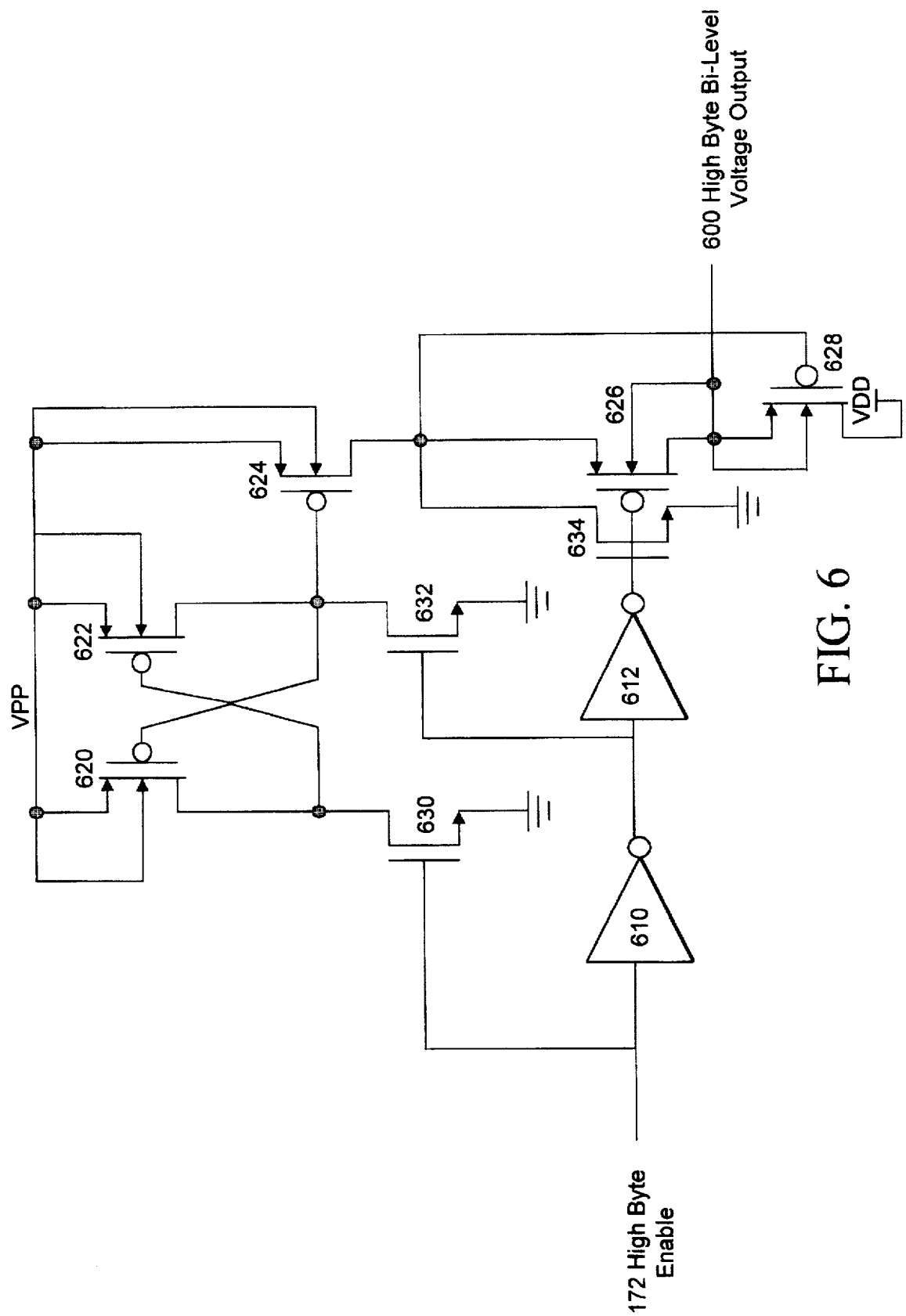
FIG. 6 is a circuit diagram of the High Byte Bi-level Voltage Source 112 from FIG. 1.

FIG. 6 is a circuit diagram illustrating the internal structure of High Byte Bi-level Voltage Source 112. This circuit is identical to the circuit of FIG. 5, except for the fact that it takes an input from High Byte Enable signal 172 instead of Low Byte Enable signal 170. The circuit illustrated in FIG. 6 operates in exactly the same way as the circuit in FIG. 5. When High Byte Enable signal 172 is asserted to a low value, High Byte Bi-level Voltage Output 600 drives a voltage of VPP, through High Byte Wordline Drivers 122 into the wordlines of High Byte Memory Array 102. This causes a programming voltage to be applied to the wordlines of High Byte Memory Array 102. When High Byte Enable signal 172 is de-asserted to a high value, this causes a voltage of VDD to be driven through High Byte Bi-level Voltage Output 600. This causes High Byte Wordline Drivers 122 to assert non-programming VDD voltages into the wordlines of High Byte Memory Array 102.

Figure 7:
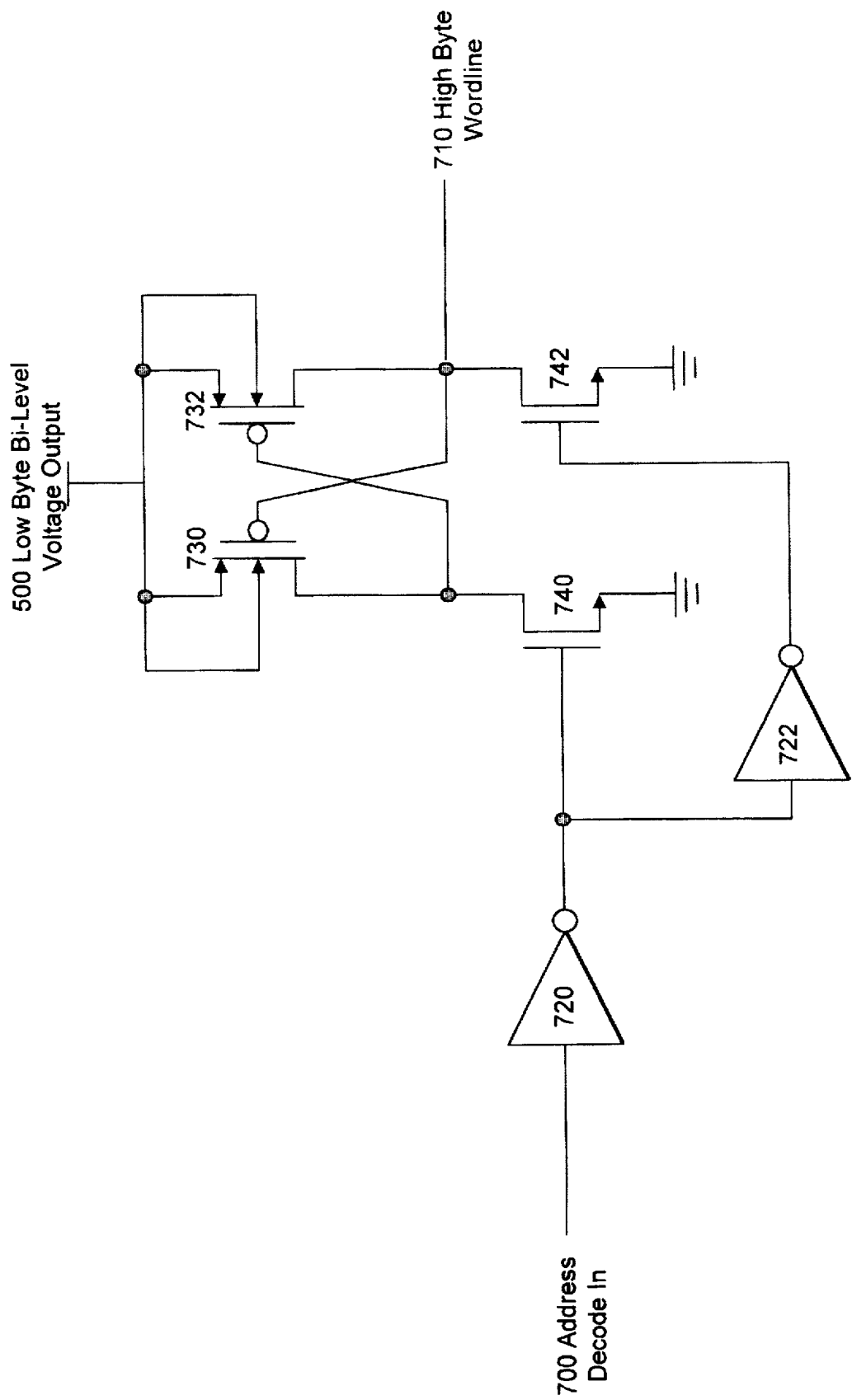
FIG. 7 is a circuit diagram for a single low byte wordline driver in accordance with an aspect of the present invention.

FIG. 7 is a circuit diagram of the internal structure of one of the Low Byte Wordline Drivers 120. The low byte wordline driver pictured in FIG. 7 takes in Address Decode Input 700 and outputs Low Byte Wordline 710. One of these wordline circuits connects to each wordline in Low Byte Memory Array 100. Address Decode In signal 700 passes through inverter 720 into the gate input of n-channel transistor 740. The output of inverter 720 also passes through inverter 722 into the gate input of n-channel transistor 742. The drains of both n-channel transistor 740 and n-channel transistor 742 connect to ground. The source of n-channel transistor 740 connects to the drain of p-channel transistor 730 and the gate input of p-channel transistor 732. The source of n-channel transistor 742 connects to the drain of p-channel transistor 732 and the gate input of p-channel transistor 730. It also connects to the output of the circuit, which is Low Byte Wordline 710. The source and substrate of p-channel transistor 730 connect to Low Byte Bi-level Voltage Output 500. Similarly, the source and substrate of p-channel transistor 732 also connect to Low Byte Bi-level Voltage Output 500.

The circuit illustrated in FIG. 7 operates as follows. When address decode input 700 is asserted low, the low voltage feeds through inverter 720 to create a high voltage at the gate input of n-channel transistor 740. This creates a conducting path between the source of n-channel transistor 740 and the drain of n-channel transistor 740, which is connected to ground. The source of n-channel transistor 740 connects to the gate input of p-channel transistor 732 causing the gate input of p-channel transistor 732 to be driven low. This creates a conducting path between the source of p-channel transistor 732, which connects to Low Byte Bi-level Voltage Output 500, and the drain of p-channel transistor 732, which connects to Low Byte Wordline 710. The high voltage output of inverter 720 passes through inverter 722 to create a low voltage input to the gate of n-channel transistor 742. This causes the source of n-channel transistor 742, which connects to Low Byte Wordline 710, to be decoupled from the drain of n-channel transistor 742, which connects to ground. The output of Low Byte Wordline 710 consequently assumes the voltage of Low Byte Bi-level Voltage Output 510.

If Address Decode Input 700 is de-asserted to a high voltage, this high voltage passes through inverter 720 to create a low value at the gate input of n-channel transistor 740. The low value also feeds through inverter 722 to create a high value at the gate input of n-channel transistor 742. This creates a conducting path between the source of n-channel transistor 742 and the drain of n-channel transistor 742, which is connected to ground. The source of n-channel transistor 742 also connects to Low Byte Wordline 710, causing Low Byte Wordline 710 to be driven to a low voltage. The low value on the gate input of n-channel transistor 740 decouples the source of n-channel transistor 740 from the drain of n-channel transistor 740, which is connected to ground. The source of n-channel transistor 742, which is now a low value, connects to the gate input of p-channel transistor 730 thereby creating a conducting path between Low Byte Bi-level Voltage Output 500 and the drain of p-channel transistor 730. The drain of p-channel transistor 730 connects into the gate input of p-channel transistor 732 causing it to be driven to a high voltage. This high voltage isolates the source of p-channel transistor 732, which connects to Low Byte Bi-level Voltage Output 500, from the drain of p-channel transistor 732, which connects to Low Byte Wordline 710. Low Byte Wordline 710, consequently assumes a ground voltage.

In summary, the collection of Low Byte Wordline Drivers 120 feeding into each of the wordlines in Low Byte Memory Array 100 creates a system which drives a ground voltage into wordlines which are not selected, and a bi-level voltage into a single wordline which is selected.

Figure 8:
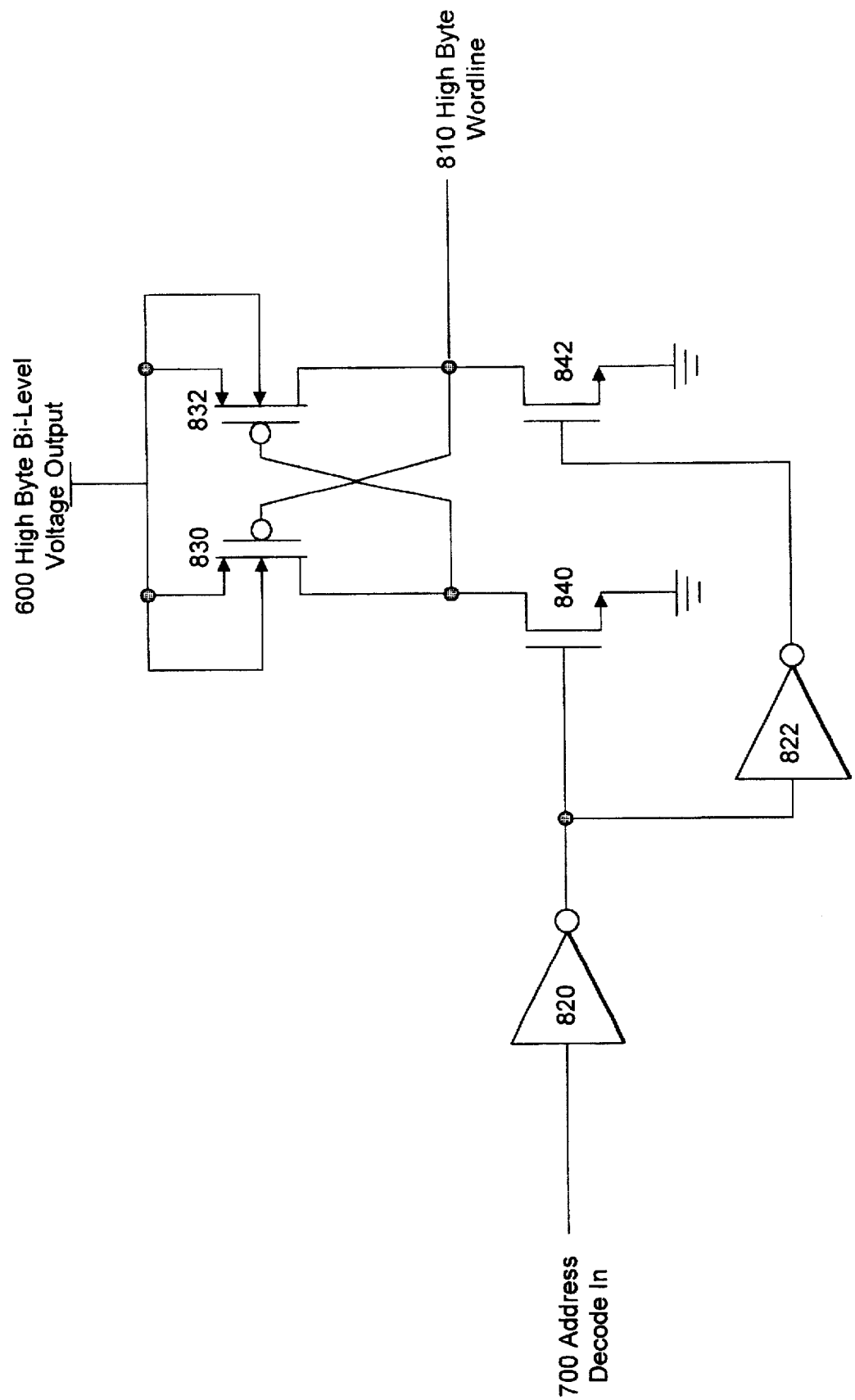
FIG. 8 is a circuit diagram for a single high byte wordline driver in accordance with an aspect of the present invention.

FIG. 8 is a circuit diagram illustrating the internal structure of one of the High Byte Wordline Drivers 122. This structure is identical to the structure for the low byte wordline driver pictured in FIG. 7, except for the fact that the source voltage to the p-channel transistors 830 and 832 is supplied by High Byte Bi-level Voltage Output 600, instead of Low Byte Bi-level Voltage Output 500. The collection of High Byte Wordline Drivers 122 creates a system which drives a ground voltage level into unselected wordlines, and a bi-level voltage into a single selected wordline.

Figure 9:
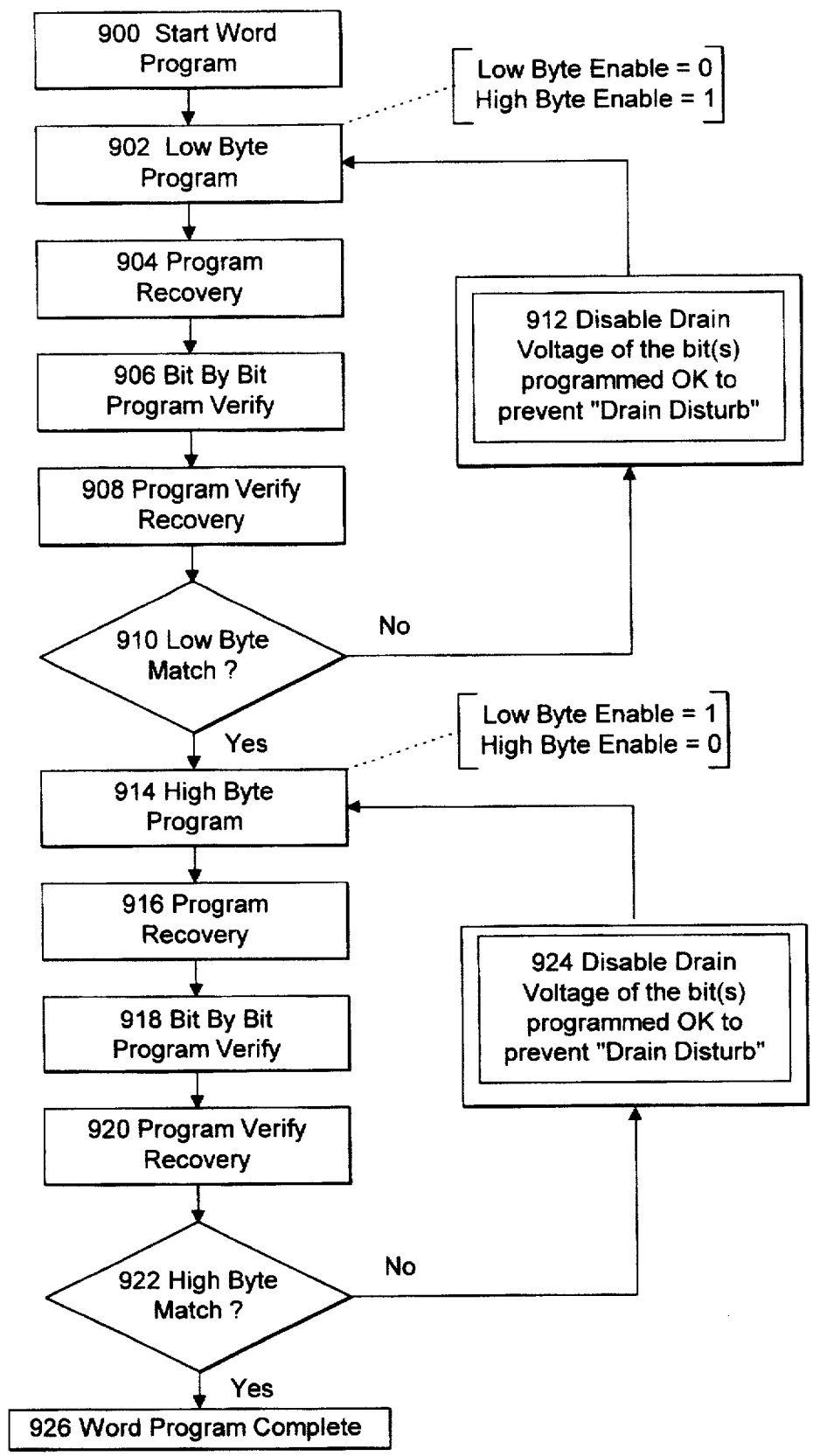
FIG. 9 is a flow chart showing the steps used to program a word from an array of floating gate memory cells in accordance with an aspect of the present invention.

FIG. 9 is a flowchart illustrating the process of performing a byte-by-byte programming of a 16-bit word in an array of floating gate memory cells according to one embodiment of the present invention.

At step 900, the word programming operation commences. An address is transmitted across address bus 160. This address splits off into a row address, which feeds into Row Decoder 130, and a column address, which feeds into both Low Byte Column Decoder 140 and High Byte Column Decoder 142. Row Decoder 130 selects one wordline driver from Low Byte Wordline Drivers 120 and one wordline driver from High Byte Wordline Drivers 122. Low byte column decoder 140 selects a set of bitlines from the array of floating gate memory cells corresponding to the low byte of the addressed word. High Byte Column Decoder 142 selects a set of bit lines corresponding to the high byte of the addressed word. Finally, data to be programmed into the addressed word in the array of floating gate cells is loaded into Data In Buffer 182 from Data Bus 180.

At step 902, the low byte programming commences. The controller for the array of floating gate memory cells (not shown) asserts Low Byte Enable signal 170 and de-asserts High Byte Enable signal 172. The asserted Low Byte Enable signal 170 causes Low Byte Bi-level Voltage Source 110 to produce a programming voltage for the selected wordline driver from Low Byte Wordline Drivers 120. The de-asserted High Byte Enable signal 172 causes High Byte Bi-level Voltage Source 112 to produce a non-programming voltage for the selected wordline driver from High Byte Wordline Drivers 122. Assuming that all Datai Flag Latches 450 have been reset, Low Byte Enable signal 170 causes the program data in structures for the low byte to be enabled, causing programming voltages to be applied to the columns of Low Byte Memory Array 100, which are selected by Low Byte Column Decoder 140. High Byte Enable signal 172 feeds into High Byte Program Data In Structures 152 causing these program data in structures to be disabled. Consequently, the bitlines selected by High Byte Column Decoder 142 will be coupled with floating outputs of High Byte Program Data In Structures 152, and no programming of the high byte will take place.

At step 904, the programming voltages are maintained throughout a program recovery period until a timer indicates that the programming recovery period is completed. This allows time for programming voltages to settle, and the floating gates to be appropriately charged or discharged.

At step 906, bit-by-bit verification takes place. The wordlines corresponding to the addressed word in both Low Byte Memory Array 100 and High Byte Memory Array 102 remain selected. However, a non-programming read voltage is applied to both of these wordlines. The outputs of the selected floating gate memory cells in the low byte are channeled from Low Byte Memory Array 100 into the data sense amplifiers, and then through the comparators to determine whether all cells in the selected byte are properly programmed. If the data in inputs match the sense amplifier outputs then Match Datai signal 400 will be generated, which will cause Datai Flag Latches 450 corresponding to the low byte to be set. This disables subsequent reprogramming of the successfully programmed bits of the low byte.

At step 908, program verify recovery takes place. Program verify voltages are maintained throughout the memory array until a timer completes. This ensures that sufficient time is allowed for the verification signals to propagate through the memory array.

At step 910, the system verifies that all of the bits within the low byte have been properly programmed. If so, the system proceeds to step 914. If not, the system loops back to step 902 to reprogram only those bits which were not properly programmed. The Datai Flag Latches 450 will disable the drain programming voltages for bits which were properly programmed to prevent drain disturb conditions. The programming process is then repeated for the low byte, except that only those bits which were not properly programmed will be reprogrammed. Not shown in FIG. 9 is that after a fixed number of iterations without successful programming, the low byte programming process will halt and an error will be indicated.

The high byte programming process consists of steps 914, 916, 918, 920 and 922. This process is exactly analogous to the low byte programming process except that the High Byte Memory Array 102 is involved. After the high byte programming process is complete, the system proceeds to step 926, and the word programming process is complete.

One embodiment of the present invention provides a bypass structure which allows the byte-at-a-time programming to be bypassed in favor of a word-at-a-time programming. This bypass is used when an external source of programming voltage is available, thereby providing sufficient programming current for word-at-a-time programming.

Other embodiments of the above-described invention are possible. This description has so far focussed on subwords which are 8-bits in size. However, other subword sizes, such as 4, 6, 10, 12 and 16 bits, can be easily used.

In another embodiment, bit-by-bit verification is provided without byte-at-a-time programming. In this embodiment, an entire word is programmed at once and only those bits within a word that fail to program are reprogrammed.

Yet another embodiment provides the byte-at-a-time programming without the bit-by-bit verification.

The foregoing description of a preferred embodiment of the invention has been presented for purposes of illustration and description only. It is not intended to be exhaustive or to limit the invention to the precise forms disclosed. Obviously, many modifications and variations will be apparent to practitioners skilled in the art.

What is claimed is:

1. An apparatus for storing data, comprising:
   a memory array comprising a plurality of words of memory, wherein each word comprises a plurality of bits of memory, wherein each bit of memory comprises a floating gate memory cell;
   an addressing mechanism to address individual words in said plurality of words of memory, wherein said addressing mechanism specifies an addressed word;
   a plurality of column lines, each of which is coupled to a plurality of floating gate memory cells from said memory array;
   a data bus comprising a plurality of data bit lines to transfer data into and out of said memory array, each of said data bit lines being coupled to a plurality of column lines from said plurality of column lines;
   programming power supply circuits coupled with said memory array, to apply programming voltages to said addressed word of memory to program and reprogram said addressed word of memory, including a plurality of column drivers, each of which is coupled to said plurality of column lines coupled to an associated data bit line of said data bus, each of said column drivers including a bit enable input for enabling programming of an individual bit within said addressed word of memory;
   program verify logic, coupled with said memory array, to separately verify programming of said addressed word of memory, and within said addressed word to separately verify programming of each of said plurality of bits to determine a set of bits failing to program; and
   control circuits to control said programming power supply circuits to program said addressed word of memory and to reprogram only said set of bits failing to program, said control circuits being coupled to: said programming power supply circuits, said bit enable inputs of said programming power supply circuits and to said program verify logic, said control circuits further including a plurality of bit program flags corresponding to respective bits within said addressed word, said bit program flags being coupled to and being set by said program verify logic to indicate a set of bits failing to program within said addressed word.

2. The apparatus for storing data of claim 1, wherein said array can be read using a supply voltage from an external source of 3.3 volts or less.

3. An apparatus for storing data, comprising:
   a memory array comprising a plurality of words of memory, wherein each word comprises a plurality of subwords of memory, wherein each subword of memory comprises a plurality of floating gate memory cells;
   an addressing mechanism to address individual words in said plurality of words of memory, wherein said addressing mechanism specifies an addressed word;

a plurality of column lines, each of which is coupled to a plurality of floating gate memory cells from said memory array;

a data bus comprising a plurality of data bit lines to transfer data into and out of said memory array, each of said data bit lines being coupled to a plurality of column lines from said plurality of column lines;

programming power supply circuits coupled with said memory array, to apply programming voltages to said addressed word of memory to program and reprogram said addressed word of memory, including a plurality of column drivers, each of which is coupled to said plurality of column lines coupled to an associated data bit line of said data bus, each of said column drivers including a subword enable input for enabling programming of an individual subword within said addressed word of memory;

program verify logic coupled with said memory array to separately verify programming of said addressed word of memory, and within said addressed word to separately verify programming of individual subwords to determine a set of subwords failing to program; and control circuits coupled to: said programming power supply circuits, said subword enable inputs of said programming power supply circuits and to said program verify logic, said control circuits controlling said programming power supply circuits to program said addressed word of memory one subword at a time and to reprogram only said set of subwords failing to program one subword at a time.

4. The apparatus for storing data of claim 3, wherein said array can be read using a supply voltage from an external source of 3.3 volts or less.

5. The apparatus for storing data of claim 3, wherein each of said plurality of subwords of memory comprises eight floating gate memory cells.

6. The apparatus for storing data of claim 5, wherein each of said plurality of words of memory comprises two subwords of memory.

7. The apparatus for storing data of claim 3, wherein said addressing mechanism comprises a wordline decoder and a plurality of column decoders.

8. The apparatus for storing data of claim 7, comprising a column decoder for each of said plurality of subwords in said addressed word of memory.

9. An apparatus for storing data, comprising:

a memory array comprising a plurality of words of memory, wherein each word comprises a plurality of subwords of memory, wherein each subword comprises a plurality of bits of memory, wherein each bit of memory comprises a floating gate memory cell;

an addressing mechanism to address individual words in said plurality of words of memory, wherein said addressing mechanism specifies an addressed word;

a plurality of column lines, each of which is coupled to a plurality of floating gate memory cells from said memory array;

a data bus comprising a plurality of data bit lines to transfer data into and out of said memory array, each of said data bit lines being coupled to a plurality of column lines from said plurality of column lines;

programming power supply circuits coupled with said memory array, to apply programming voltages to said addressed word of memory to program and reprogram said addressed word of memory, including a plurality of column drivers, each of which is coupled to said plurality of column lines coupled to an associated data bit line of said data bus, each of said column drivers including a bit enable input and a byte enable input for separately enabling programming of an individual bit within an individual subword within said addressed word of memory;

program verify logic coupled with said memory array to separately verify programming of said addressed word of memory, and within said addressed word to separately verify programming of individual subwords to determine a set of subwords failing to program, and within each of said set of subwords failing to program, to separately verify programming of individual bits of memory to determine a set of bits failing to program; and control circuits coupled to: said programming power supply circuits, said bit enable and subword enable inputs of said programming power supply circuits and to said program verify logic, said control circuits including a plurality of bit program flags corresponding to respective bits within said addressed word, said bit program flags being coupled to and being set by said program verify logic to indicate a set of bits failing to program within said addressed word, said control circuits controlling said programming power supply circuits to program said addressed word of memory one subword at a time, and to reprogram only said set of subwords failing to program one subword at a time, and within each of said set of subwords failing to program to reprogram only said set of bits failing to program.

10. The apparatus for storing data of claim 9, wherein said array can be read using a supply voltage from an external source of 3.3 volts or less.

11. The apparatus for storing data of claim 9, wherein each of said plurality of subwords of memory consists of eight floating gate memory cells.

12. The apparatus for storing data of claim 11, wherein each of said plurality of words of memory consists of two subwords of memory.

13. The apparatus for storing data of claim 9, wherein said addressing mechanism comprises a wordline decoder and a plurality of column decoders.

14. The apparatus for storing data of claim 13, comprising a column decoder for each of said plurality of subwords in said addressed word of memory.

15. An apparatus for storing data, comprising:

a memory array comprising a plurality of words of memory, wherein each word comprises a plurality of bits of memory, wherein each bit of memory comprises a floating gate memory cell;

an addressing mechanism to address individual words in said plurality of words of memory, wherein said addressing mechanism specifies an addressed word;

a plurality of column lines, each of which is coupled to a plurality of floating gate memory cells from said memory array;

a data bus comprising a plurality of data bit lines to transfer data into and out of said memory array, each of said data bit lines being coupled to a plurality of column lines from said plurality of column lines;

programming power supply circuits coupled with said memory array, to apply programming voltages to said addressed word of memory to program and reprogram said addressed word of memory;

program verify logic, coupled with said memory array, to separately verify programming of said addressed word of memory, and within said addressed word to separately verify programming of each of said plurality of bits of memory to determine a set of bits failing to program; and control circuits, coupled to said programming power supply circuits and to said program verify logic to control said programming power supply circuits to program said addressed word of memory and to reprogram only said set of bits failing to program.

16. The apparatus for storing data of claim 15, wherein said array can be read using a supply voltage from an external source of 3.3 volts or less.

17. The apparatus for storing data of claim 15, wherein said programming power supply circuits include a plurality of column drivers, each of which is coupled to said plurality of column lines coupled to an associated data bit line of said data bus, each of said column drivers including a bit enable input coupled to said control circuits for enabling programming of an individual bit within said addressed word of memory.

18. The apparatus for storing data of claim 15, wherein said control circuits further include a plurality of bit program flags corresponding to respective bits within said addressed word; and wherein said program verify logic further includes logic to control said plurality of bit program flags to indicate said set of bits failing to program within said addressed word.

19. An apparatus for storing data, comprising:

a memory array comprising a plurality of words of memory, wherein each word comprises a plurality of subwords of memory, wherein each subword of memory comprises a plurality of floating gate memory cells;

an addressing mechanism to address individual words in said plurality of words of memory, wherein said addressing mechanism specifies an addressed word;

a plurality of column lines, each of which is coupled to a plurality of floating gate memory cells from said memory array;

a data bus comprising a plurality of data bit lines to transfer data into and out of said memory array, each of said data bit lines being coupled to a plurality of column lines from said plurality of column lines;

programming power supply circuits coupled with said memory array, to apply programming voltages to said addressed word of memory to automatically program and reprogram said addressed word memory one subword at a time;

program verify logic, coupled with said memory array, to separately verify programming of said addressed word of memory, and within said addressed word to separately verify programming of individual subwords to determine a set of subwords failing to program; and control circuits, coupled to said programming power supply circuits and to said program verify logic to control said power supply circuits to program said addressed word of memory one subword at a time and to reprogram only said set of subwords failing to program one subword at a time.

20. The apparatus for storing data of claim 19, wherein said array can be read using a supply voltage from an external source of 3.3 volts or less.

21. The apparatus for storing data of claim 19, wherein said programming power supply circuits further include a plurality of column drivers, each of which is coupled to said plurality of column lines coupled to an associated data bit line of said data bus, each of said column drivers including a subword enable input coupled to said control circuits for enabling programming of an individual subword within said addressed word of memory.

22. The apparatus for storing data of claim 19, wherein each of said plurality of subwords of memory comprises eight floating gate memory cells.

23. The apparatus for storing data of claim 22, wherein each of said plurality of words of memory comprises two subwords of memory.

24. The apparatus for storing data of claim 19, wherein said addressing mechanism includes a wordline decoder and a plurality of column decoders.

25. The apparatus for storing data of claim 24, including a column decoder for each of said plurality of subwords in said addressed word of memory.

26. An apparatus for storing data, comprising:

a memory array comprising a plurality of words of memory, wherein each word comprises a plurality of subwords of memory, wherein each subword comprises a plurality of bits of memory, wherein each bit of memory comprises a floating gate memory cell;

an addressing mechanism to address individual words in said plurality of words of memory, wherein said addressing mechanism specifies an addressed word;

a plurality of column lines, each of which is coupled to a plurality of floating gate memory cells from said memory array;

a data bus comprising a plurality of data bit lines to transfer data into and out of said memory array, each of said data bit lines being coupled to a plurality of column lines from said plurality of column lines;

programming power supply circuits coupled with said memory array, to apply programming voltages to said addressed word of memory to automatically program and reprogram said addressed word memory;

program verify logic, coupled with said memory array, to separately verify programming of said addressed word of memory, and within said addressed word to separately verify programming of individual subwords to determine a set of subwords failing to program, and within each of said set of subwords failing to program to separately verify programming of individual bits of memory to determine a set of bits failing to program; and control circuits coupled to said programming power supply circuits and to said program verify logic to control said power supply circuits to program said addressed word of memory and to reprogram only said set of subwords failing to program one subword at a time, and within each of said set of subwords failing to program to reprogram only said set of bits failing to program.

27. The apparatus for storing data of claim 26, wherein said array can be read using a supply voltage from an external source of 3.3 volts or less.

28. The apparatus for storing data of claim 26, wherein said programming power supply circuits further include a plurality of column drivers, each of which is coupled to said plurality of column lines coupled to an associated data bit line of said data bus, each of said column drivers including a bit enable input and a byte enable input coupled to said control circuits for separately enabling programming of a bit within a subword of said addressed word of memory.

29. The apparatus for storing data of claim 26, wherein said control circuits further include a plurality of bit program flags corresponding to respective bits within said addressed word; and wherein said program verify logic is coupled to and controls said plurality of bit program flags to indicate said set of bits failing to program within said addressed word.

30. The apparatus for storing data of claim 26, wherein each of said plurality of subwords of memory consists of eight floating gate memory cells.

31. The apparatus for storing data of claim 30, wherein each of said plurality of words of memory consists of two subwords of memory.

32. The apparatus for storing data of claim 26, wherein said addressing mechanism comprises a wordline decoder and a plurality of column decoders.

33. The apparatus for storing data of claim 32, comprising a column decoder for each of said plurality of subwords in said addressed word of memory.

34. In an array of floating gate memory cells, including a plurality of words of memory, each word including a plurality of bits of memory, said memory array including an addressing mechanism to address individual words in said plurality of words of memory, a method for programming an array of floating gate cells, comprising:

selecting an addressed word of memory with said addressing mechanism;

programming said addressed word of memory;

verifying the programming of each of said plurality of bits in said addressed word of memory; and reprogramming only those bits which fail to program.

35. The method for programming an array of floating gate memory cells of claim 34, wherein said array can be read using a supply voltage from an external source of 3.3 volts or less.

36. The method for programming an array of floating gate memory cells of claim 34, wherein:

said step of verifying the programming of each of said plurality of bits includes setting a plurality of bit program flags corresponding to respective bits within said addressed word to indicate a set of bits failing to program; and said step of reprogramming only those bits which fail to program involves using said bit program flags to enable said reprogramming of bits in said addressed word of memory.

37. In an array of floating gate memory cells, including a plurality of words of memory, each word including a plurality of subwords of memory, wherein each subword of memory includes a plurality of floating gate memory cells, said memory array including an addressing mechanism to address individual words in said plurality of words of memory, a method for programming an array of floating gate cells, comprising:

selecting an addressed word of memory with said addressing mechanism;

automatically programming said plurality of subwords of said addressed word of memory one subword at a time;

verifying the programming of each of said plurality of subwords in said addressed word of memory; and automatically reprogramming only those subwords which fail to program one subword at a time.

38. The method for programming an array of floating gate memory cells of claim 37, wherein said array can be read using a supply voltage from an external source of 3.3 volts or less.

39. The method for programming an array of floating gate cells of claim 37, wherein each of said plurality of subwords of memory comprises eight floating gate memory cells.

40. The method for programming an array of floating gate cells of claim 39, wherein each of said plurality of words of memory comprises two subwords of memory.

41. In an array of floating gate memory cells, including a plurality of words of memory, each word including a plurality of subwords of memory, wherein a each subword of memory includes a plurality of bits of memory, wherein each bit of memory comprises a floating gate memory cell, said memory array including an addressing mechanism to address individual words in said plurality of words of memory, a method for programming an array of floating gate cells, comprising:

selecting an addressed word of memory with said addressing mechanism;

automatically programming said plurality of subwords of said addressed word of memory one subword at a time;

verifying the programming of each of said plurality of subwords in said addressed word of memory, wherein said verifying includes verifying the programming of each of said plurality of bits in each said subword; and automatically reprogramming one subword at a time only those subwords which fail to program within said addressed word of memory, wherein said reprogramming involves reprogramming only those bits which fail to program.

42. The method for programming an array of floating gate memory cells of claim 41, wherein said array can be read using a supply voltage from an external source of 3.3 volts or less.

43. The method for programming an array of floating gate memory cells of claim 41, wherein:

said step of verifying the programming of each of said plurality of subwords includes setting a plurality of bit program flags corresponding to respective bits within said addressed word to indicate a set of bits failing to program; and said step of automatically reprogramming only those subwords which fail to program uses said bit program flags to enable said reprogramming of said bits which fail to program.

44. The method for programming an array of floating gate cells of claim 41, wherein each of said plurality of subwords of memory comprises eight floating gate memory cells.

45. The method for programming an array of floating gate cells of claim 44, wherein each of said plurality of words of memory comprises two subwords of memory.

* * * * *